(12) United States Patent
Schulz-Harder

(10) Patent No.: US 7,814,655 B2
(45) Date of Patent: Oct. 19, 2010

(54) HEAT SINK IN THE FORM OF A HEAT PIPE AND PROCESS FOR MANUFACTURING SUCH A HEAT SINK

(75) Inventor: Jürgen Schulz-Harder, Lauf (DE)

(73) Assignee: Electrovac AG, Klosterneuberg (AT)

( * ) Notice: Subject to any disclaimer, the term of this patent is extended or adjusted under 35 U.S.C. 154(b) by 39 days.

(21) Appl. No.: 12/081,622

(22) Filed: Apr. 18, 2008

(65) Prior Publication Data
US 2008/0189948 A1    Aug. 14, 2008

Related U.S. Application Data

(62) Division of application No. 10/702,085, filed on Nov. 6, 2003, now abandoned.

(30) Foreign Application Priority Data
Dec. 30, 2002    (DE) ............... 102 61 402

(51) Int. Cl.
*B21K 1/32* (2006.01)
*B23P 15/26* (2006.01)
*B23K 31/02* (2006.01)
*F28D 15/00* (2006.01)
*H05K 7/20* (2006.01)

(52) U.S. Cl. ............ 29/890.032; 29/726; 29/890.045; 165/104.21; 165/104.26; 228/122.1; 361/700

(58) Field of Classification Search ............ 29/726, 29/890.032, 890.045; 165/104.21, 104.26; 228/122.1
See application file for complete search history.

(56) References Cited

U.S. PATENT DOCUMENTS

| | | | | |
|---|---|---|---|---|
| 3,680,189 | A | 8/1972 | Noren | 29/890.032 |
| 3,994,430 | A * | 11/1976 | Cusano et al. | 228/122.1 |
| 4,046,190 | A | 9/1977 | Marcus et al. | 164/104.26 |
| 4,118,756 | A | 10/1978 | Nelson et al. | 361/700 |
| 4,274,479 | A | 6/1981 | Eastman | 165/104.26 |
| 4,461,343 | A | 7/1984 | Token et al. | 165/104.26 |
| 5,465,782 | A | 11/1995 | Sun et al. | 165/104.26 |
| 5,465,898 | A * | 11/1995 | Schulz-Harder et al. | 228/122.1 |
| 6,082,443 | A | 7/2000 | Yamamoto et al. | 165/104.26 |
| 6,227,287 | B1 | 5/2001 | Tanaka et al. | 165/80.4 |
| 6,256,201 | B1 | 7/2001 | Ikeda et al. | 361/704 |
| 6,302,192 | B1 | 10/2001 | Dussinger et al. | 165/104.26 |
| 6,880,626 | B2 | 4/2005 | Lindemuth et al. | 165/104.26 |
| 7,306,573 | B2 | 5/2006 | Koning et al. | 165/185 |

* cited by examiner

*Primary Examiner*—David P Bryant
*Assistant Examiner*—Alexander P Taousakis
(74) *Attorney, Agent, or Firm*—Welsh Flaxman & Gitler LLC

(57) ABSTRACT

A heat sink designed as a heat pipe has an interior space in a body of the heat sink that is closed toward the outside. The interior space has at least one vapor channel and at least one fluid space connected with the vapor space and having a porous or capillary structure. The heat pipe is made using the DCB process to connect each end of posts within the interior space directly with one of the two opposing walls forming the interior space.

12 Claims, 9 Drawing Sheets

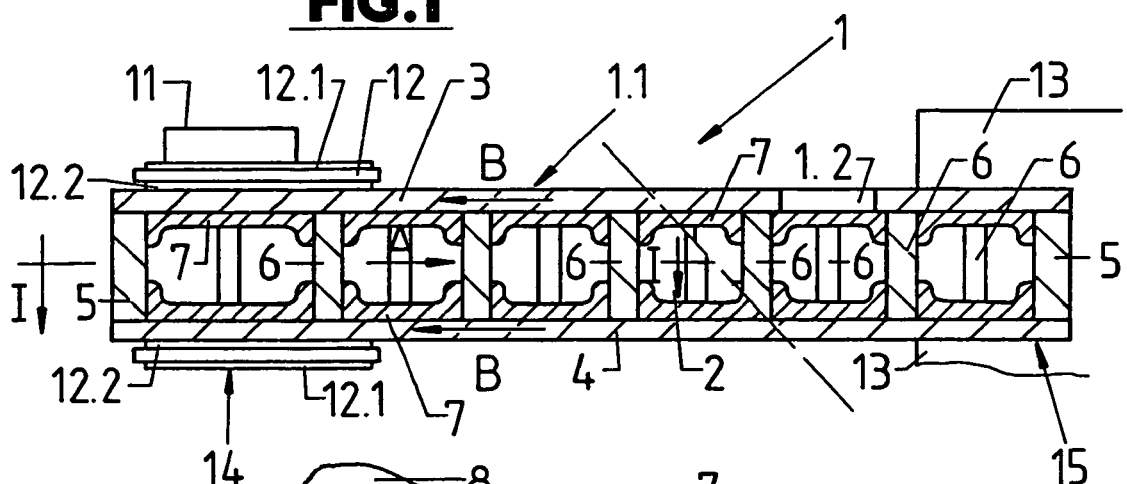
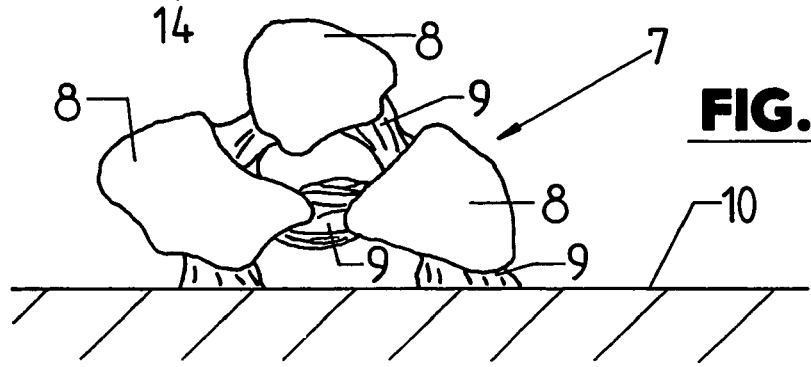
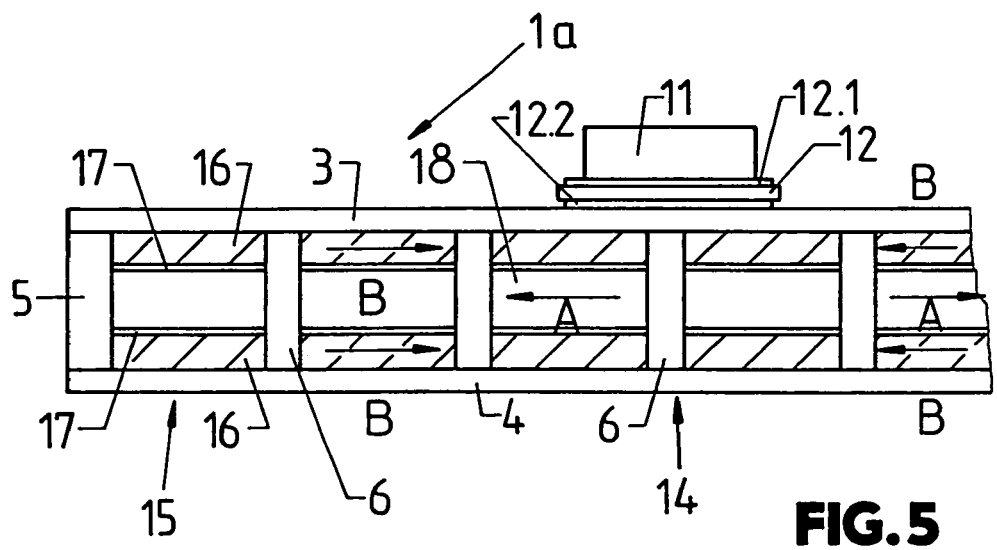

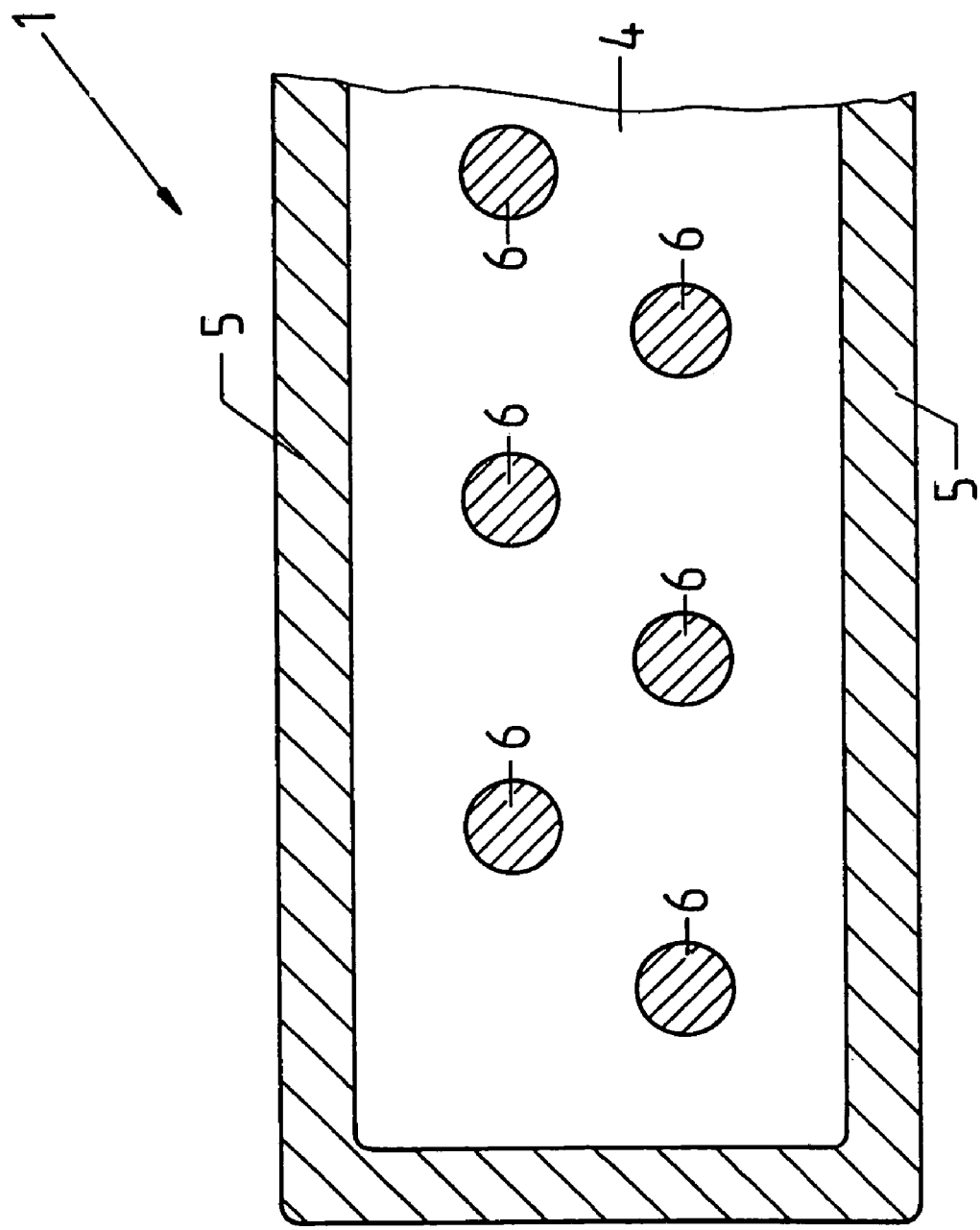

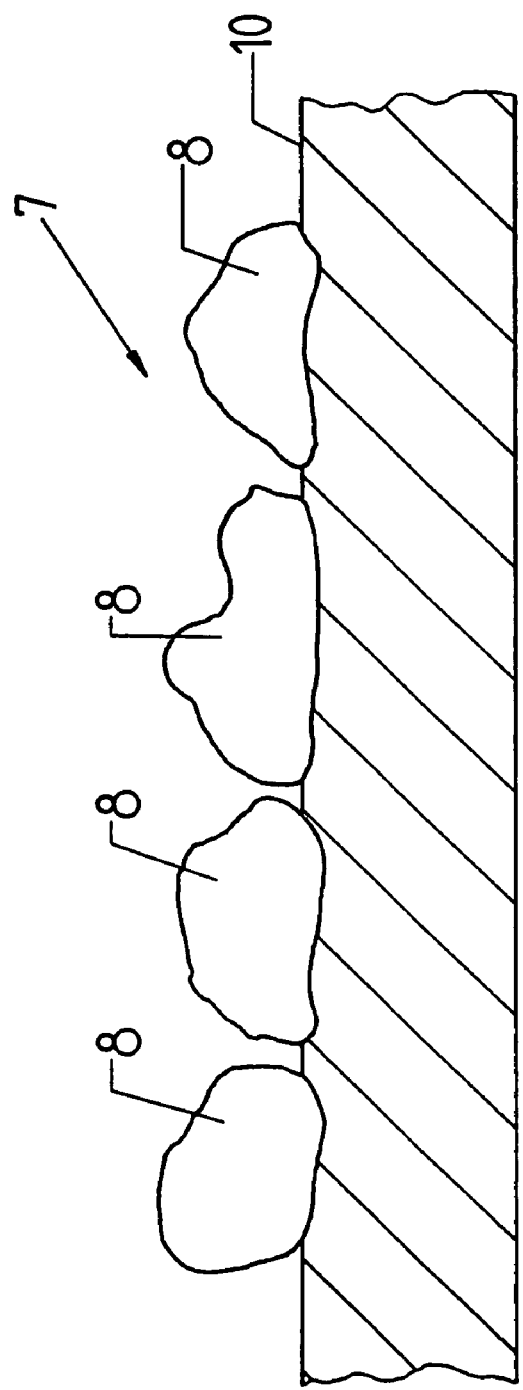

FIG. 6
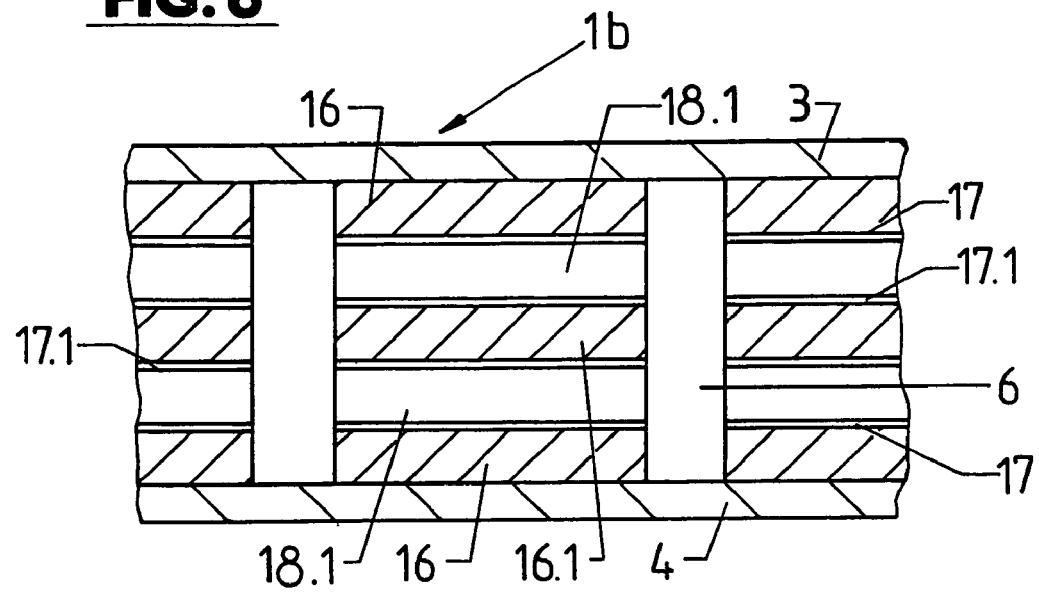
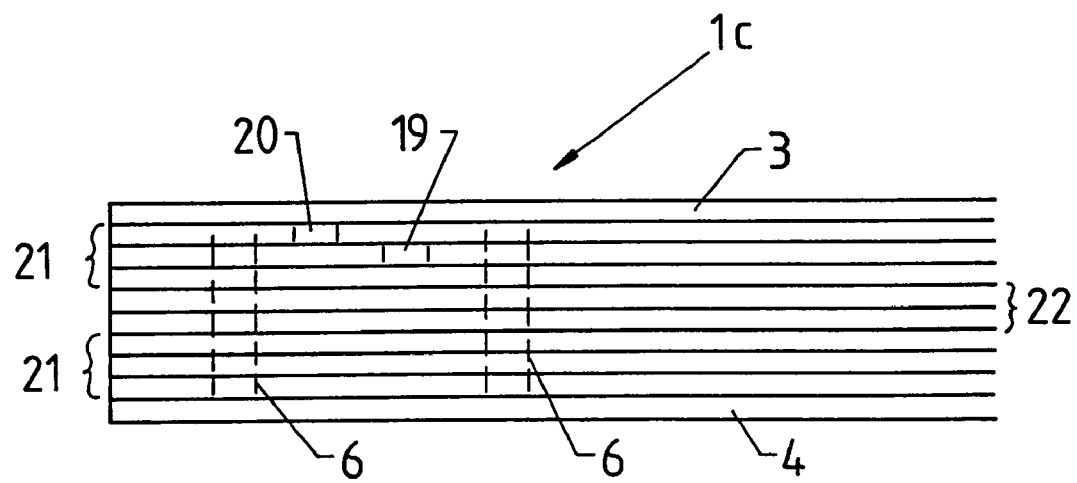
FIG. 7

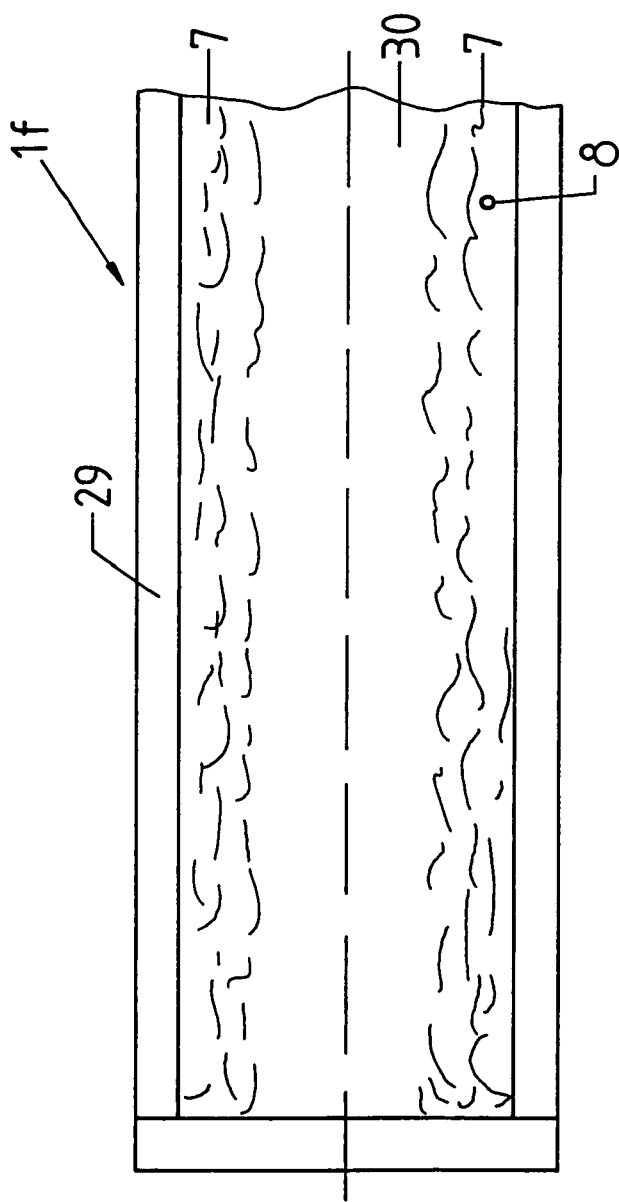
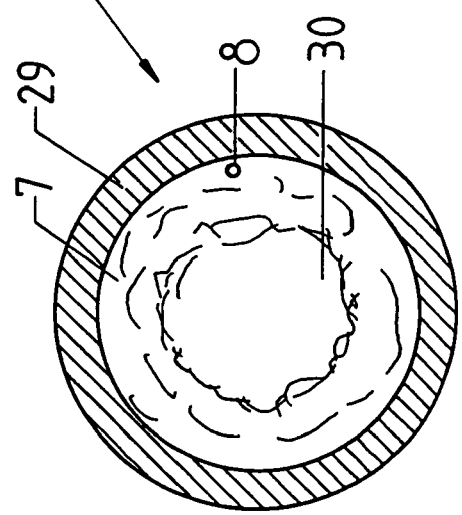

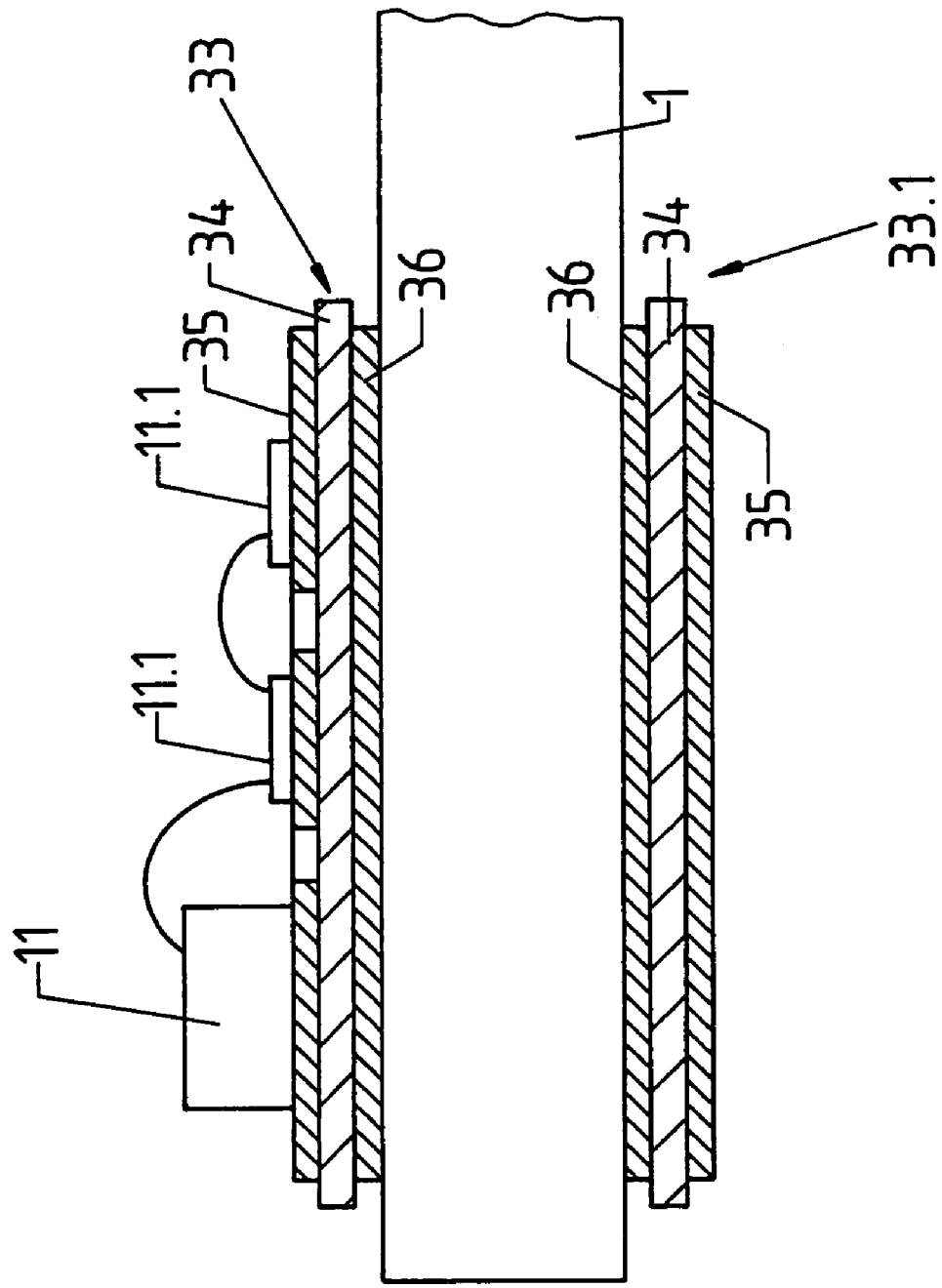

HEAT SINK IN THE FORM OF A HEAT PIPE AND PROCESS FOR MANUFACTURING SUCH A HEAT SINK

This application is a divisional of Ser. No. 10/702,085, filed Nov. 6, 2003 now abandoned.

FIELD OF THE INVENTION

The present invention relates to a heat sink in the form of a heat pipe.

BACKGROUND OF THE INVENTION

A heat sink designed as a flat, plate-shaped heat pipe is known in the art (U.S. Pat. No. 3,680,189). The known heat sink consists essentially of a cuboid or plate-shaped hollow body, the interior of which is delimited by two walls forming the top and bottom and by one peripheral wall. On each of the inner surfaces of the wall sections forming the top and bottom is a layer forming a capillary or porous structure. These layers are held to their respective walls by several posts located in the interior of the hollow body in a staggered pattern. The interior of the hollow body serves to contain an easily vaporizable heat-transporting medium. This medium vaporizes in order to cool, for example, an electric, heat loss producing component located on the heat pipe in a vaporization area, i.e. where the component is located and condenses in a condensation area spatially distant from the vaporization area, i.e. where the heat is dissipated and can then flow back to the vaporization area in the capillary structures.

Also known in the art is the so-called DCB (direct copper bond) technology. This technology, described for example in U.S. Pat. No. 3,744,120 or DE-PS 23 19 854, makes it possible to bond metal surfaces, for example copper, or metal and ceramic surfaces, whereby the metals have a layer or coating (melt layer) on their surfaces of a chemical compound made of the metal and a reactive gas, preferably oxygen. This melt layer forms a eutectic with a melting temperature below the melting temperature of the metal (e.g. copper), so that after joining the materials to be bonded, they can be bonded by heating, in particular by melting the melt layer. The processing temperature in this DCB technology is between approximately 1025 and 1083° C.

The object of the invention is to provide a heat pipe featuring improved efficiency.

SUMMARY OF THE INVENTION

A special feature of the invention consists in the fact that between the first two opposing wall sections or walls that delimit the interior of the hollow body to form the heat pipe there are several spatially separated posts, which are directly connected with these walls and, like these wall sections, are made of a material with high heat conductivity, for example of metal, such as copper.

Corresponding to further embodiments of the invention, the at least one capillary or porous area (fluid area) is formed by a plurality of particles that are connected with each other by means of bonding and/or sintering and/or form a loose mass, so as to form capillary flow paths between the particles. The particles are thereby preferably made of ceramic, for example of an aluminum oxide ceramic, and by means of DCB bonding technology are bonded together and also with adjacent surfaces of the body of the heat pipe to form the capillary structure.

BRIEF DESCRIPTION OF THE DRAWINGS

The invention is described in more detail below referring to the drawings based on exemplary embodiments.

FIG. 1 shows a simplified representation of a longitudinal cross section of a heat sink in the form of a heat pipe according to the invention;

FIG. 2 shows a cross section corresponding to the line 1-1 of FIG. 1;

FIG. 3 and 4 show an enlarged view of the particles forming the porous layer or capillary layer;

FIG. 5 and 6 show cross sections similar to FIG. 1 of further possible other embodiments of the invention;

FIG. 7 shows a simplified partial side view of a further embodiment of the invention;

FIG. 11-14 each show a longitudinal cross section (partial view) and a cross section of two further embodiments of the invention;

FIG. 15 shows an electric circuit using a heat pipe.

DETAILED DESCRIPTION OF THE INVENTION

Figure 8:
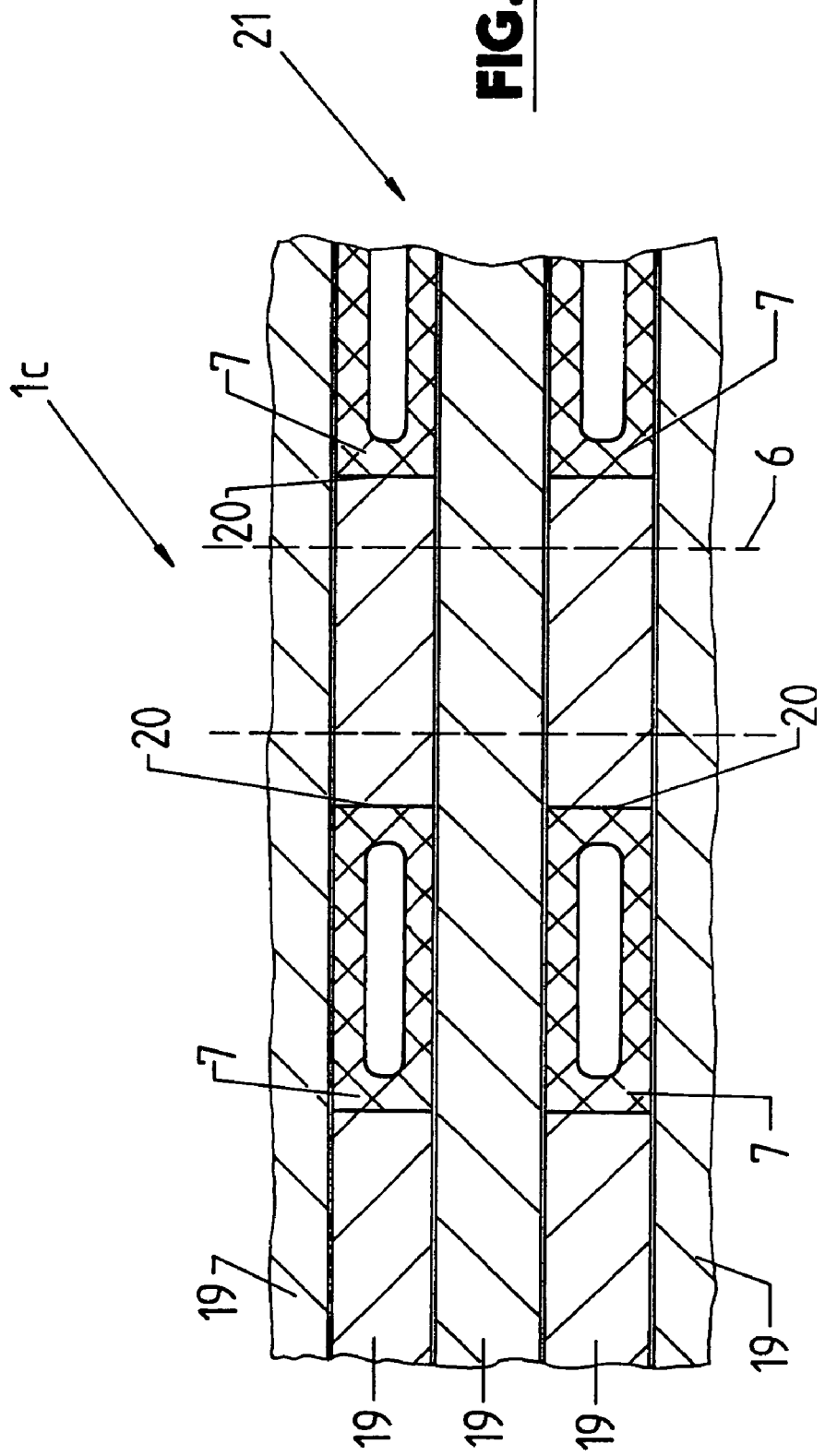
FIG. 8 shows an enlarged view of a partial cross section of the heat sink in FIG. 7.

In FIGS. 1 and 2, 1 generally designates a heat sink designed as a heat pipe. This heat sink 1 has a flat, plate-shaped design and comprises a flat, cuboid or plate-shaped hollow body 1.1, the interior 2 of which is delimited on the two opposing sides with the larger surfaces by walls 3 and 4 and on the perimeter by a peripheral wall 5. In the interior 2 there is a plurality of spatially separated posts 6, the axes of which are perpendicular to the planes of the walls 3 and 4 and each of which is connected at one end directly with the inside of the wall 3 and at the other end directly with the inside of the wall 4.

The walls 3 and 4 have, for example, a rectangular or square shape. The posts 6 each have a diameter which is only a fraction of the width and length of the interior 2, i.e. none of the posts 6 extends throughout the entire length or width of the interior 2.

The walls 3 and 4, the peripheral wall 5 and the posts 6 are made of a material that conducts heat very well, for example metal, such as copper, whereby the DCB technology known to those skilled in the art is preferably used for manufacturing the heat sink 1, i.e. to bond the walls 3 and 4, the peripheral wall 5 and the posts 6.

In the depicted embodiment, the insides of the walls 3 and 4, and also partially the inside of the peripheral wall 5 and the posts 6 are provided with a capillary or porous layer 7 forming a capillary layer or space. The latter is comprised of a plurality of particles 8 as seen in FIG. 3, which are connected in a suitable manner with each other and with the respective adjacent surface 10, for example of the walls 3 and 4, the peripheral wall 5 and the posts 6. The particles 8 are for example made of aluminum oxide, aluminum nitride and/or silicon nitride that are connected with each other by means of copper or copper bridges or stays 9 and with the adjacent surface 10 possessing the layer 7. The particles 8 have a grain size for example between 0.5 and 250 im. In the embodiment in FIG. 3 the particles 8 form two layers or rows. It is also possible, however, to provide the particles 8 in only one layer on the surface 10.

The layer 7 is applied in such a manner that after manufacturing the hollow body 1.1, a mixture of the particles 8 and a pulverized copper oxide, possibly also with copper powder added, is inserted into the interior 2 through at least one fill opening 1.2. Afterwards, the hollow body is heated to a temperature at which the copper/copper oxide eutectic is transformed into a melted state, i.e. to a temperature between 1065 and 1085° C., so that the melting of the copper/copper oxide eutectic causes the formation of the copper stays 9 connecting the particles 8 with each other and with the surface 10 possessing the layer 7.

By means of a suitable movement, for example shaking, of the hollow body, the layer 7 is formed in the desired manner on all required inner surfaces of the hollow space 2. After cooling of the hollow body and therefore after bonding of the layer 7, the non-bonded particles 8 are removed from the interior 2.

Generally it is also possible to use particles 8 already coated with copper instead of a mixture of particles 8, the copper powder and the copper oxide powder, whereby the copper layer encompassing these particles 8 is oxidized on the outer surface, so that upon heating to the bond temperature between 1065 and 1085° C. the copper stays 9 are formed.

It was already mentioned above in connection with FIG. 3 that the particles 8 for forming the layer 7 can be provided on the surface 10 in multiple layers or multiple row. If the particles 8 are provided in a single layer on the surface 10, then the thickness of the layer 7 is approximately equivalent to the grain size of these particles and in the case of multiple layers equivalent or approximately equivalent to a multiple of the grain size of the particles 8.

FIG. 4 shows as a possible further embodiment for the formation of the porous layer 7 in the manner that the particles 8 are directly connected with the surface 10 by means of DCB bonding, and there is no connection of the particles 8 with each other, so that the corresponding copper stays or bridges 9 do not exist. This produces a structure by means of the porous layer 7 in which the particles 8 are provided in a single layer, but resulting in a very distinct capillary structure between the particles 8 in which the effective diameter of the capillaries can be adjusted by changing the grain size of the particles 8.

Moreover, it is also possible to produce the layer 7 before the heat sink 1 or the hollow body forming this heat sink is closed or sealed. In this case, the upper wall 3, for example, is not connected with the peripheral wall 5 and the posts 6 until after the layer 7 has been provided on the inner surface of the lower wall 6 and possibly also on part of the inner surface of the peripheral wall 5 and on part of the height of the posts 6.

After completion of the layer 7 an easily vaporizable, heat-transporting medium is inserted into the interior 2 through the opening 1.2 and then the interior 2 is completely sealed at the opening 1.2. The heat-transporting medium may be a medium which is liquid at room temperature and is in a vaporized phase at temperatures higher than room temperature, for example alcohol.

In FIG. 1, 11 designates a heat loss producing electric component, which is located on top of the heat sink 1, i.e. on the outer surface of the wall 3, and is electrically insulated from the wall 3 by means of a layer 12 made of an electrically insulating material, for example of ceramic. The layer 12 contains structured metallizations 12.1 and 12.2, of which the metallization 1.2 forms conductors, contact surfaces, etc. and the metallization 12.2 serves as a connection with the heat sink. For reasons of symmetry, a layer with metallizations corresponding to the layer 12 is likewise applied to the bottom surface of the heat sink 1, i.e. on the outer surface of the wall 4, both layers 12 being applied for example by means of DCB technology.

In the depicted embodiment the component 11 is located on one narrow side of the heat sink 1, which is rectangular when viewed from the top. On the opposite narrow side of the heat sink, coolers 13 are located on the top and bottom, each consisting for example of a passive cooling element or active coolers through which a heat transporting medium flows as part of a cooling circuit.

The heat dissipated from the component 11 causes vaporization of the heat transporting medium in the interior 2 in the vicinity of this component or the vaporization area generally designated 14 in FIG. 1. In the area of the cooler 13, i.e. at the condensation area generally designated 15 in FIG. 1, the heat transporting medium condenses due to cooling and then flows back to the vaporization area 14 with the layers 7 in the liquid phase. This produces a circuit in the interior of the heat sink, in particular in the area of the interior 2 not occupied by the layers 7 which can also be referred to as a vapor space or vapor channel. The circuit is formed by the flow of the vaporized heat transporting medium in the direction of the arrow A from the vaporization area 14 to the condensation area 15 parallel to the planes of the walls 3 and 4 and within the layers 7 or within the capillary space formed by these layers in the direction of the arrow B from the condensation area 15 back to the vaporization area 14, likewise parallel to the planes of the walls 3 and 4.

The posts 6, each of which is connected directly with the walls 3 and 4, produces a high degree of stability, in particular pressure resistance, for the heat sink 1. Furthermore, optimum heat transfer is achieved between the top wall 3 and bottom wall 4, resulting in optimum functioning of this heat sink.

FIG. 5 shows a simplified cross section of a heat sink 1a designed as a heat pipe that differs from the heat sink 1 essentially by the fact that instead of the fluid channels formed by the layers 7 along the top wall 3 and the bottom wall 4, there is one fluid channel 16 respectively, each of which is separated by a wall 17 from the vaporization channel 18 formed between the two fluid channels 16 or between the two walls 17. The top and bottom walls 3 and 4 are likewise directly connected with each other by means of several spatially separated posts 6, which also extend through the intermediate walls 17 and a partial length of which extend within the two fluid channels 16. A suitable material for the intermediate walls is a perforated flat material, for example a perforated metal plate or foil, e.g. a perforated plate or foil made of copper. However, other materials can also be used for the intermediate wall 17, for example a grid-like flat material or a mesh material or metal, etc.

The intermediate walls 17 are parallel to the top and bottom walls 3 and 4 and are located at a distance from these walls, respectively. The fluid channels are likewise filled with a porous, capillary material, for example with the particles 8, e.g. of aluminum oxide, whereby these particles 8 are also connected with each other and with the inner surfaces of the respective fluid channel 16 by means of the copper stays 9 in the fluid channels 16. This produces a connection between the outer walls 3 and 4 and the respective intermediate wall 17 at least by means of the particles 8 bonded to the posts 6 and the intermediate walls 17.

The heat sink 1a and its hollow body are likewise manufactured using DCB technology, whereby for execution of the fluid channels 16, the mixture for example of the particles 8 and copper oxide powder, possibly with additional pulverized copper is inserted in the recesses forming these channels and then heated to the bond temperature between 1065-1085° C. Excess material that is not bonded is then removed.

In the embodiment in FIG. 5 the heat loss producing electric component 11 is not on a narrow side of the likewise cuboid or flat plate heat sink 1a, but rather in the center of this heat sink. Coolers corresponding to the coolers 13 are located on both ends of the heat sink. This results in two circuits in the interior of the heat sink 1a for the heat transporting medium and two vapor streams corresponding to the arrows A each extending in the vapor channel 18 from the vaporization area 14 in the middle of the heat sink 1a to one end of the heat sink 1a or to one condensation area 15, respectively, and in the fluid channels 16 the fluid flowing corresponding to the arrows B, extending from each condensation area 15 back to the vaporization area 14.

FIG. 6 shows a heat sink 1b designed as a flat, plate-like heat pipe that differs from the heat sink 1a only in that the vapor channel 18 of the heat sink 1a is further divided into two vapor channels 18.1 by a further fluid channel 16.1 extending parallel to the top and bottom of the heat sink 1b. The posts 6 also extend through this additional fluid channel 16.1. The two vapor channels 18.1 are then both delimited by an intermediate wall 17 of the adjacent fluid channel 16 and an intermediate wall 17.1 of the adjacent vapor channel 16.1. The intermediate walls 17.1, which are likewise parallel to the plane of the top wall 3 and the bottom wall 4, also are made of the perforated flat material.

FIG. 7 shows in a very schematic cross section view a further heat sink 1c designed as a flat heat pipe that has a plurality of plates 19 located between the top wall 3 and the bottom wall 4 and connected at the surfaces in a stack-like manner.

The plates 19 are structured or perforated, i.e. provided with openings, so as to produce a plurality of flow channels through the openings 20 of the plates within the volume of the heat sink 1c formed by the plates 19. Furthermore, the plates 19 are structured so as to form continuous posts 6 in areas outside of the openings 20. The posts extend between the top wall 3 and the bottom wall 4. The plates 19 are made of a material that conducts heat well, for example of metal and especially of copper. The surfaces of the plates 19 are connected with each other by means of DCB technology or a soldering process.

Suitable structures for the plates 19 are described for example in DE 197 10 783 A1. In the embodiment depicted in FIG. 7, the openings 20 and the flow channels formed by these openings are filled with the capillary material in an area 21 adjacent to the top wall 3 and in an area adjacent to the bottom wall 4. The capillary material comprise the particles 8 connected with the copper stays 9 and with adjoining surfaces of the plates 19. The areas 21 then form the fluid channels for the heat transporting medium. In a middle area 21 the openings 20 of the plates 19 without the particles 8 form a vapor channel for the vaporized heat transporting medium.

Through the openings 20 and the structures produced by these openings the plates 19 not only form the continuous posts 6, but also stays 19.1 extending between these posts within the fluid channels for the heat transporting medium. The stays 19.1 formed respectively by a plate 19 are located opposite of openings 20 in adjacent plates 19, as represented schematically in FIG. 8. In this Figure, 7 designates the porous or capillary layer, for example, particles 8. This layer covers all bare surfaces in this embodiment in the areas 21 and on the plates 19.

It goes without saying that the heat sink 1c can also be modified to contain several areas 21 forming fluid channels, in alternation with an area 22 forming a vapor channel.

Figure 9:
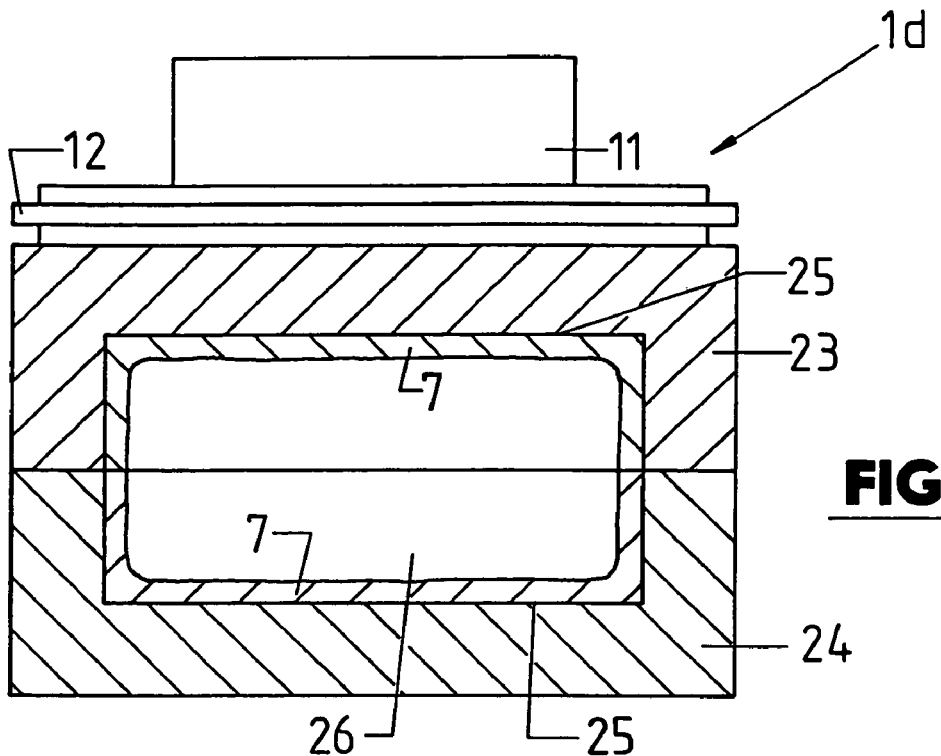
FIG. 9 and 10 show a simplified view of cross sections of further possible other embodiments of the invention.

FIG. 9 shows a heat sink 1d in a cross section view perpendicular to the direction of flow of the heat transporting medium. This heat sink consists of two plates 23 and 24 made of a material that conducts heat well, for example of copper, connected with each other on one surface. In each plate there is a trough-shaped depression or recess 25. With the plates 23 and 24 connected, the two recesses 25 form a closed, elongated channel 26 within the body of the heat sink 1d. The inner surfaces of the channel 26 are provided with the capillary layer 7, so as to produce the fluid channel within this layer and the vapor channel in the space of the channel 26 not occupied by the layer 7.

Figure 10:
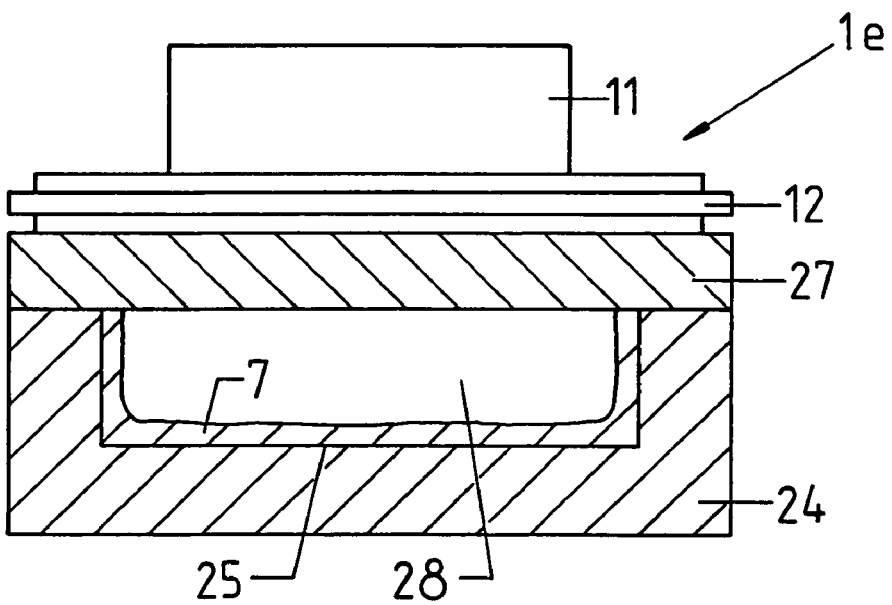

FIG. 10 shows in a variation of FIG. 9 a heat sink 1e designed as a flat heat pipe, in which the plate 24 with the recess 25 is likewise used, but instead of the plate 23, a plate 27 without the recess is used. The plate 27 is connected on the surface with the side of the plate 24 that has the recess 25, resulting in the closed channel 28 corresponding to the channel 26. Surfaces of the recess 25 are provided with the layer 7. The plate 27 is for example a metal plate, e.g. a copper plate or copper foil. Generally, it is also possible to manufacture the plate 27 from an electrically insulating material, for example from ceramic, such as an aluminum oxide or aluminum nitride ceramic.

The component 11 to be cooled is located in the heat sink 1d and 1e at an area of the outer surface of the heat sink directly adjacent to the channel 26 or 28, likewise electrically insulated from the body of the heat sink 1d or 1e by the insulating layer 12 provided with the electric contact surfaces.

If the plate 27 is made of an electrically insulating material, namely of ceramic, then the conductors and/or contact surfaces for the component 11 can be located directly on the top side of the plate 27 facing away from the channel 28.

FIGS. 11 and 12 show as a further possible embodiment of a heat sink designed as a heat pipe, the hollow body of which consists of a pipe section 29 closed at both ends and manufactured from a material with high heat conductivity, for example copper. In the depicted embodiment the pipe section 29 has a regular cylindrical inner and outer profile. Generally it is also possible for the heat sink if to have a flat design, in particular by pressing the pipe section 29 flat into an oval profile.

The porous or capillary layer 7 is formed on the inner surface of the pipe section 29. This layer is produced in the manner that the material forming the layer 7, for example the mixture consisting of the particles 8 and the pulverized copper oxide and copper, is inserted into the pipe section 29. The material forming the layer 7 is inserted in such a way that it forms a ring or hollow cylinder-shaped first mass in contact with the inner surface of the pipe section 29. Further inward and in this embodiment surrounded by the first mass is a support medium 30, for example in the form of a second mass made of a suitable particle-like material, for example particles made of ceramic without the addition of copper oxide and copper.

After heating this structure to the bond temperature and after subsequent cooling, only the particles 8 of the first mass are connected by means of the copper bridges or copper stays 9 with the inner surface of the pipe section 29 and with each other to form the porous layer 7, while the particles forming the second mass or the support medium 30 can be removed after bonding.

Figure 13:
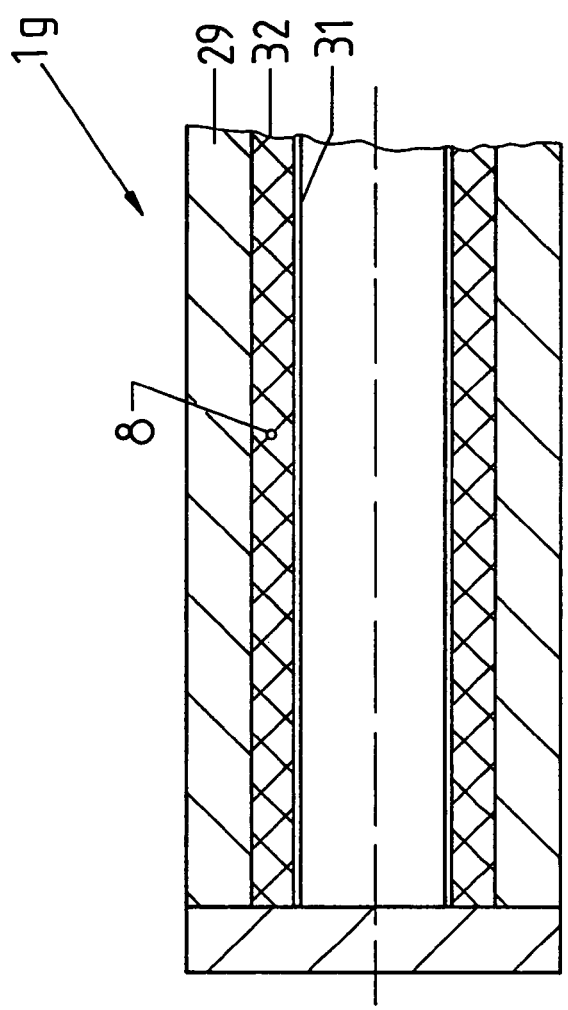
Figure 14:
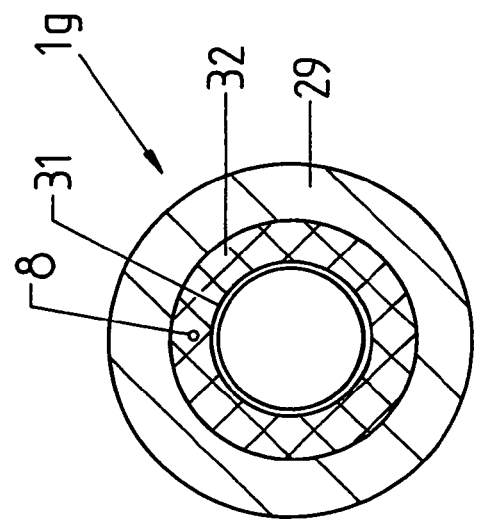

FIGS. 13 and 14 show as a further possible embodiment a heat sink 1g designed as a heat pipe. In this heat sink 1g the hollow body is again formed from the pipe section 29 closed at both ends and made of the material with high heat conductivity, for example copper. Inside the pipe section 29 is a further pipe section 31 made of a perforated or sieve-like material, such that a ring space 32 is formed between the outer surface of the pipe section 31 and the inner surface of the pipe section 29. This space forms the fluid channel in this heat sink 1g. The interior of the pipe section 31 forms the vapor channel. The ring space 32 is filled with a mass consisting of the particles 8 and/or of corresponding particles forming a capillary structure, which are connected by means of bonding or sintering with each other and possibly also with the inner surface of the pipe section 29 and the outer surface of the pipe section 31, for example by means of the copper stays 9 or by means of corresponding metal or copper stays. Generally it is also possible that the ring space 32 contains the particles forming the porous or capillary structure as a loose mass. The pipe section 31 is perforated, for example, provided with a plurality of openings or manufactured from a perforated flat material, in particular of a material with high heat conductivity, for example of metal, e.g. copper. Other materials are also conceivable for the pipe section 31, for example screen-like, weave-like or mesh material. Furthermore it is also possible to use the pipe section 31 on as a support body during production, i.e. during bonding of the particles 8 contained in the ring space 32, after which it is removed again.

FIG. 15 shows a simplified representation of the use of the heat sink or heat pipe according to the invention in an electric circuit. The heat sink is designated 1 in FIG. 15. It goes without saying that every other heat sink according to the invention can also be used for this application, one of the heat sinks 1a-1g.

A copper-ceramic substrate 33 is applied to the top of the flat heat sink 1 as the basis for the electric components, which are designated 11 and 11.1 in this drawing. This substrate consists of a ceramic layer 34, which is provided on both sides with a copper layer or copper foil 35 and 36, preferably using DCB technology. The substrate 33 is connected by means of the copper layer 36 with the top surface of the heat sink 1, by soldering or some other suitable method. The copper layer 35 facing away from the heat sink 1 is structured for forming conductors, contact surfaces, etc. The components 11 and 11.1 are fastened, for example soldered, whereby the component 11 is a power component and the components 11.1 are control components.

In the embodiment in FIG. 15 the substrate 33 is located with the components 11 and 11.1 in the area of one narrow side of the long heat sink 1. The coolers 13 are located in the area of the other narrow side. For reasons of symmetry and to prevent the bi-metal effect and the deformation of the structure upon changes in temperature, a substrate 33.1 corresponding to the substrate 33 is applied to the bottom of the heat sink 1, however without the components 11 and 11.1.

The invention was described above based on sample embodiments. It goes without saying that further modifications or alterations are possible, without abandoning the underlying inventive idea of the invention. For example, it is possible to provide components on both sides of the flat or plate-shaped heat sink, e.g. on the second substrate 33.1 of the embodiment in FIG. 15.

Furthermore, it is possible to use other materials to manufacture the porous, capillary structure, for example particles made of a different ceramic or another suitable material, e.g. silicon oxide. Furthermore, it is also possible to produce these structures for example by sintering of a suitable material, for example a suitable metal.

In deviation from the manufacturing method described in connection with FIGS. 11 and 12 it is also possible in the manufacture of the heat sink 1f to insert the particles 8 made of ceramic or another heat-resistant material in the pipe section made of metal, for example of copper and oxidized at least on the inner surface, as a mass that completely fills the pipe section 29 and then to heat the structure to the bond temperature between 1065-1085° C., after which the structure is allowed to cool. The outer particles, i.e. those in contact with the inner surface of the pipe section are then bonded with the inner surface of the pipe section 29. The remainder of the mass can then be removed from the pipe section 29, resulting in a porous, capillary structure in the form of a single layer 7.

Furthermore, it was assumed in the depiction in FIG. 8 that the openings forming the flow channels in the heat sink 1c are only partially filled with the porous or capillary layer 7 or the particles 8 forming this layer. Of course, it is also possible to completely fill the openings or the flow channels formed by these openings with the particles 8 in the areas 21.

REFERENCE NUMBERS

1-1g heat sink or heat pipe
1.1 hollow body
1.2 opening
2 interior
3, 4 top and bottom wall of the flat heat pipe
5 peripheral wall
6 post
7 porous or capillary layer
8 particle
9 copper stay
10 surface
11, 11.1 component
12 insulating layer with structured metallization
12.1, 12.2 metallization
13 cooler
14 vaporization area
15 condensation area
16 fluid channel
17, 17.1 intermediate wall
18, 18a vapor channel
19 plate or foil
20 opening
21, 22 area of heat sink 1c
23, 24 plate
25 recess
26 channel
27 plate
28 channel
29 pipe section
30 support medium
31 pipe section
32 ring space
33, 33.1 metal ceramic substrate, for example copper ceramic substrate
34 ceramic layer
35, 36 metal layer, for example copper layer

I claim:

1. A process for manufacturing a heat pipe, the heat pipe comprising:
   a heat pipe body with at least one interior space in the heat pipe body, the interior space being closed toward the outside by walls,
   at least one vapor channel and at least one fluid channel connected to the at least one vapor channel and having a porous or capillary structure in the interior space, the porous or capillary structure comprising particles of ceramic materials connected with each other and with an inner surface of the interior space of the heat pipe body such that the capillary or porous flow paths are formed between the particles
and
several spatially separated posts extending through the interior space and between two opposing walls delimiting the interior space, the posts and the walls being made of metal with high heat conductivity, and wherein
the process comprising:
connecting each post at both ends directly with one of the two opposing walls by means of DCB-bonding and,
connecting the particles of ceramic with the interior space of the heat pipe body by DCB-bonding upon heating to a bond temperature between 1065 and 1085° C. and through shaking so that a melting of a copper/copper oxide eutectic causes a formation of copper stays connecting the particles of ceramic material with each other and with a surface of the interior space of the heat pipe body to produce the capillary structure.

2. A process as claimed in claim 1, wherein the porous or capillary structure is produced by insertion of a mixture or mass of particles made of the heat-resistant material and pulverized copper oxide or oxidized copper particles and by subsequent DCB bonding.

3. A process as claimed in claim 2, wherein the mass or mixture additionally contains copper particles.

4. A process as claimed in claim 2, wherein, after bonding and cooling, the excess portion of the mass or mixture is removed.

5. A process as claimed in claim 2, wherein the mass or mixture forming the capillary structure is inserted in the interior through at least one opening and is distributed there before bonding by shaking, vibration or turning.

6. A process claimed in claim 1, wherein the capillary or porous structure or layer is produced before sealing the interior of the heat sink.

7. A process as claimed in claim 1, wherein during the manufacture of the porous or capillary structure at least one part of the interior of the heat sink forming a vapor area is filled or kept free by means of a support medium before bonding of the particles forming the porous or capillary structure.

8. A process as claimed in claim 7, wherein the support medium is removed after bonding or after manufacturing the porous or capillary structure.

9. A process as claimed in claim 7, wherein the support medium remains in the heat sink.

10. A process as claimed in claim 7, wherein the support medium is a particle-like medium.

11. A process as claimed in claim 7, wherein the support medium is formed from a wall.

12. A process for manufacturing a heat pipe, the heat pipe comprising:
a heat pipe body with at least one interior space in the heat pipe body, the interior space being closed toward the outside by walls,
at least one vapor channel and at least one fluid channel connected to the at least one vapor channel and having a porous or capillary structure in the interior space, the porous or capillary structure comprising particles of ceramic materials connected with each other and with an inner surface of the interior space of the heat pipe body such that the capillary or porous flow paths are formed between the particles
and
several spatially separated posts extending through the interior space and between two opposing walls delimiting the interior space, the posts and the walls being made of metal with high heat conductivity, and wherein the process comprising:
connecting each post at both ends directly with one of the two opposing walls by means of DCB-bonding and,
connecting the particles of ceramic with the interior space of the heat pipe body by DCB-bonding upon heating to a bond temperature between 1065 and 1085° C.

* * * * *